United States Patent [19]

Lin

[11] Patent Number: 5,498,555
[45] Date of Patent: Mar. 12, 1996

[54] METHOD OF MAKING LDD WITH POLYSILICON AND DIELECTRIC SPACERS

[75] Inventor: Jenping Lin, Taoyuan, Taiwan

[73] Assignee: United Microelectronics Corporation, Hsinchu, Taiwan

[21] Appl. No.: 334,955

[22] Filed: Nov. 7, 1994

[51] Int. Cl.$^6$ ............................................. H01L 21/8242
[52] U.S. Cl. .................. 437/35; 437/44; 437/984; 437/200; 257/344
[58] Field of Search .................. 437/43, 44, 41, 437/909, 35, 200; 257/336, 344

[56] References Cited

U.S. PATENT DOCUMENTS

| | | | |
|---|---|---|---|
| 5,073,514 | 12/1991 | Ito et al. | 437/44 |
| 5,089,432 | 2/1992 | Yoo | 437/40 |
| 5,091,763 | 2/1992 | Sanchez | 357/23.9 |
| 5,108,939 | 4/1992 | Manley et al. | 437/43 |
| 5,200,351 | 4/1993 | Hadjizadeh-Amini | 437/44 |
| 5,358,879 | 10/1994 | Brady et al. | 437/44 |

FOREIGN PATENT DOCUMENTS 2292833  12/1990  Japan.

*Primary Examiner*—George Fourson
*Assistant Examiner*—Richard A. Booth
*Attorney, Agent, or Firm*—George O. Saile; Wolmar Stoffel

[57] ABSTRACT

An improved FET device in which the hot carrier immunity and current driving capability are improved, and the sub-threshold leakage current is minimized. The device has a gate electrode with vertical sidewalls, and a thin layer of SiO$_2$ over the electrode. A first polysilicon spacer is provided on the vertical sidewalls, with a second overlying oxide spacer over the first spacer. The top portion of the SiO$_2$ layer between the gate electrode and the polysilicon spacer is made conductive enough to keep the gate electrode and the polysilicon spacer at the same potential. Lightly doped source and drain regions are provided.

16 Claims, 4 Drawing Sheets

METHOD OF MAKING LDD WITH POLYSILICON AND DIELECTRIC SPACERS

BACKGROUND OF THE INVENTION (1) Field of the Invention

The present invention relates to improvements in field effect transistors (FET) semiconductor devices and method of manufacturing the devices, more particularly to FET devices with a double spacer for high performance and high immunity to hot carrier effects.

(2) Description of the Prior Art

It is well known to provide a spacer element on the vertical sidewall of the gate of an FET device. Such spacer elements are conventionally formed by initially providing a gate insulating film on the surface of a semiconductor device, forming a layer of polycrystalline silicon over the gate insulator film and then patterning the layer and film to form a electrode with vertical sidewalls. An ion implantation is performed using the gate electrode as a mask to form a lightly doped shallow impurity region in the substrate. Subsequently, a conformal layer of insulating material, typically $SiO_2$, is deposited on the surface of the gate electrode and vertical sidewalls, and the surface of the substrate. The conformal $SiO_2$ layer is then etched by anisotropic reactive ion etching. The $SiO_2$ layer is removed on the horizontal surface areas of the gate electrode and substrate. However, portions of the layer remain on the vertical sidewalls of the gate electrode acting as spacers. A second deeper ion implantation is then performed, using the gate electrode and sidewall spacer elements as a mask. The ion implantation results in source and drain impurity regions in the substrate. The first impurity regions are joined to the second impurity regions and provide low doped shallow regions that extend beneath the spacer elements. The impurity regions are of course suitably annealed to heal the crystalline damage in the substrate caused by the ion implantations. The spacer elements provide a method of forming the lightly doped source and drain regions adjacent the gate electrode. The lightly doped drain (LDD) region reduces the longitudinal peak electric field at the drain end, thereby relieving the hot carrier effects. The conventional LDD structure, however, has the problem of "spacer-induced degradation". The trapped electrons in the oxide spacer induce positive charges in the LDD region, leading to the increase of LDD resistance and the degradation of current driving capability. Several fully overlapped LDD structures have been proposed to solve this problem. With the gate and the LDD region fully overlapped, the positive gate voltage for NMOSFETs induces negative charges in the LDD region and alleviates the spacer-induced degradation. Moreover, the greater vertical electric field in the LDD regions opposes the hot electron injection.

One of the best ways to achieve full overlap between the gate and the LDD is to use a conductive spacer (e.g. doped polysilicon) rather than an oxide spacer. Sub-half micron NMOS transistors with better current driving capability and additional immunity to hot carrier induced degradation have been demonstrated with single polysilicon spacer. However, the devices with single polysilicon spacer still have problems such as incompatibility with the Self-Aligned siliCIDE (SALICIDE) process, suffering of the contact to gate design rule and large gate to drain overlap capacitance $C_{gd}$.

This invention overcomes the above problems with double spacers, where the inner spacer is comprised of conductive material (e.g. doped polysilicon) and the outer spacer is comprised of material with low dielectric constant (e.g. $SiO_2$). The deeper source/drain implant is self-aligned to the outer oxide spacer edge. With the outer oxide spacer, a much thinner polysilicon spacer can be used, thereby reducing the suffering of the contact to gate design rule and the gate to drain overlap capacitance. The above reasoning is based on a published simulation result that the longitudinal electric field peak, corresponding to the location for hot carrier injection, is very localized at the gate edge. Hence, a thin polysilicon spacer is enough to cover most of the area where hot carriers inject into the gate oxide under the spacer. The outer oxide spacer provides another freedom for the LDD length $L_{n-}$ optimization. Furthermore, the outer oxide spacer makes the new structure compatible with the SALICIDE process and less susceptible to the band-to-band tunneling effect.

Various U.S. Patents have proposed a number of double spacer elements for gate electrodes. U.S. Pat. Nos. 5,108,939 to Manley et al, 5,073,514 to Ito et al, 5,091,763 to Sanchez and Japanese Patent 2-292833 to Nawata, show various double spacer structures.

SUMMARY OF THE INVENTION

It is an object of the invention to provide improved spacer structures for the gate electrode of an FET.

It is an object of the invention to provide new methods for forming improved spacer structures for the gate electrode of an FET.

Another object of the invention is to provide improved spacer structures that have high immunity to hot carrier effects and improve the current during capability of an FET.

Yet another object of the invention is to provide double spacer structures for gate electrodes for FETs that are compatible with the self-aligned silicide process and the gate to contact design rules for high density VLSI circuits.

In accordance with the aforementioned objectives, a method of forming a FET semiconductor device on a substrate is presented. The method includes the steps of forming a gate insulating layer on a substrate, forming a polysilicon gate electrode having vertical sidewalls on the gate insulating layer, and forming shallow low concentration impurity regions in the substrate using the gate electrode as a mask. A short oxidation process is then performed to form a thin silicon oxide layer on the gate electrode and to repair the gate oxide exposed during the polysilicon gate etch. A conformal layer of polysilicon is deposited over the electrode and anisotropically etched to form polysilicon spacers on the sidewalls of the gate electrode over the $SiO_2$ layer. A conformal layer of $SiO_2$ is deposited and anisotropically etched to form $SiO_2$ spacers over the polysilicon spacers. Ions are implanted in the substrate using the gate electrode and spacers as a mask to form source and drain regions. The top portion of the thin silicon oxide film between the polysilicon gate sidewall and the polysilicon spacer is damaged due to the deeper source/drain implant, therefore becoming conductive enough to keep the polysilicon gate and the polysilicon spacer at the same potential.

An improved FET device is presented having a thin gate insulating layer over a substrate, a polysilicon gate electrode, shallow impurity regions that terminate adjacent the edges of the gate electrode, and a thin layer of $SiO_2$ over the vertical sidewalls of the gate electrode. First spacer elements of polysilicon on the vertical sidewalls of the gate electrode are provided along with second spacer elements of $SiO_2$ over the first spacers. Source and drain regions in the substrate that terminate adjacent the edges of the second spacers are joined to the shallow impurity regions that underlie the first and second spacers. The top portion of the thin $SiO_2$ film between the gate electrode sidewall and the polysilicon spacer is made conductive enough to keep the gate electrode and the polysilicon spacer at the same potential.

DETAILED DESCRIPTION OF PREFERRED EMBODIMENTS

Figure 4:
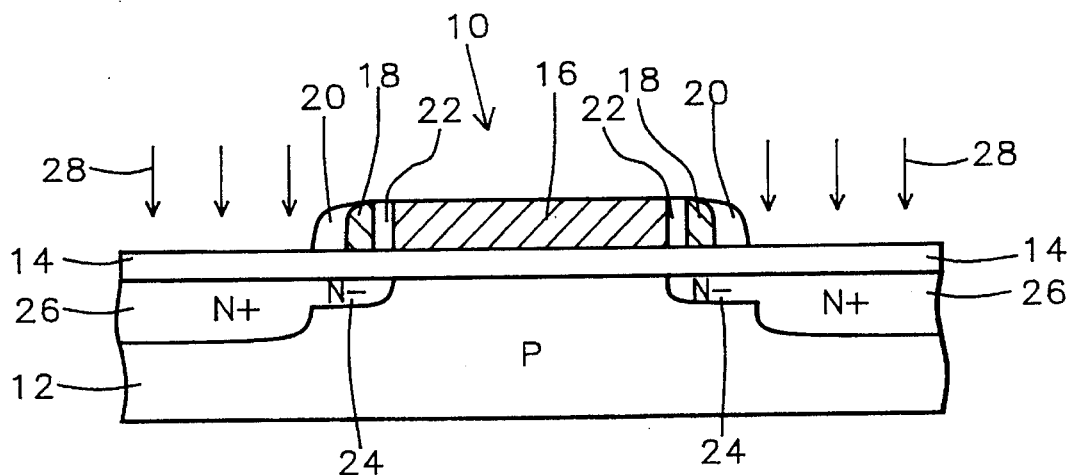

Referring now to the drawings, and more particularly to FIG. 4, there is depicted a first embodiment 10 of the invention. Substrate 12 is a semiconductor wafer, more preferably a monocrystalline silicon wafer with a crystalline orientation of <100> as defined by the Miller indices. Although only a single FET device is shown for purposes of illustration, it is understood that in actual practice, many devices are fabricated on a single semiconductor wafer as widely practiced in the art. The substrate 12 has a background doping which could be either P or N type. A thin gate dielectric layer 14 is provided on the surface of the substrate 12, preferably a $SiO_2$ layer with a thickness of between about 70 to 150 Angstroms. A gate electrode 16 of a conductive material is provided on layer 14. Electrode 16 has vertical sidewalls and is formed preferably of polycrystalline silicon, i.e. polysilicon, with a thickness of between about 1000 to 4000 Angstroms. Electrode 16 can alternately be formed of a polycide, i.e. a layer of polysilicon with an overlying layer of refractory metal which has been heated to form a surface layer of refractory silicide. Electrode 16 has a first spacer element 18 of polysilicon on each of the vertical sidewalls thereof, and a second spacer element 20 of a dielectric material, preferably $SiO_2$, over spacers 18. Both the gate electrode 16 and spacers 18 are electrically conductive because they are doped with a suitable impurity for semiconductors. A thin dielectric layer 22 is preferably provided on the vertical sidewalls of electrode 16 beneath spacer element 18. Lightly doped shallow impurity regions 24, of a dopant opposite in type to the background dopant in substrate, are provided beneath layer 22 and spacer elements 18 and 20. Note that the regions 24 terminate adjacent the vertical sidewall edge of electrode 16. The impurity concentration of regions 24 is between about $1\times10^{18}$ cm$^{-3}$ to $1\times10^{19}$ cm$^{-3}$. The depth of regions 24 is between about 500 to 1500 Angstroms. Deeper and more heavily doped impurity regions 26 are located adjacent regions 24 and constitute the source and drain regions of the transistor. The impurity concentration of regions 26 is between about $1\times10^{19}$ cm$^{-3}$ to $1\times10^{21}$ cm$^{-3}$, and the depth is between about 1000 to 3000 Angstroms.

In the aforedescribed embodiment, the polysilicon spacer helps to improve the hot carrier immunity of an FET. The dielectric spacer 20 is introduced to serve not only the purpose as conventional spacers known in the art, i.e. to offset the lightly doped regions 24 from the more heavily doped regions 26. With the outer dielectric spacer, the thickness of the polysilicon spacer can be minimized, thereby reducing the gate to drain overlap capacitance and the suffering of gate to contact design rule. Furthermore, the outer dielectric spacer makes an FET with polysilicon spacers compatible with the self-aligned silicide process and less susceptible to the band-to-band tunneling effect.

Figure 1:
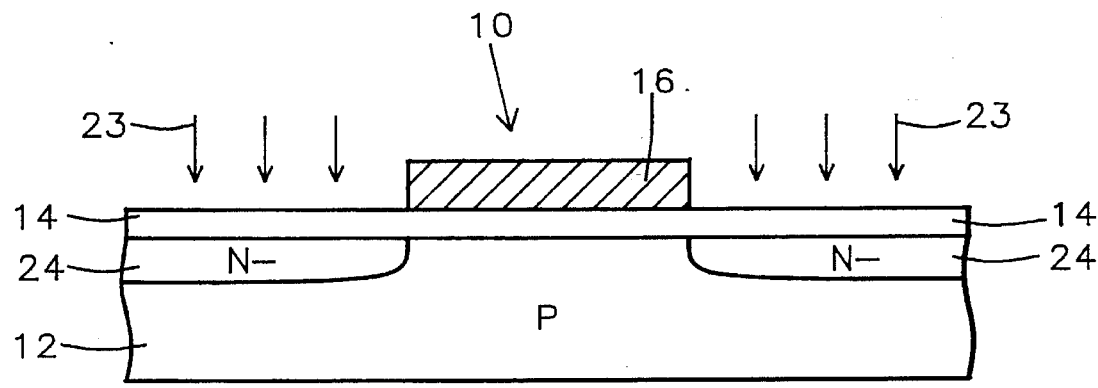
FIGS. 1–4 are cross sectional views, in greatly enlarged scale, that depict a sequence of steps that illustrate a first preferred specific embodiment of the invention.

Referring now to FIGS. 1–4, the method of fabricating the first embodiment of the invention will be explained. As shown in FIG. 1, a gate dielectric layer 14 is formed on the surface of semiconductor substrate layer 12. Layer 14 is preferably $SiO_2$ deposited by exposing the silicon substrate to an oxidizing environment, i.e. a steam or $O_2$ environment at a temperature of between about 800° C. to 950° C. for a time between about 10 minutes to 1 hour. The resultant layer 14 has a thickness of between about 70 to 150 Angstroms. An overlying layer of polysilicon is deposited over layer 14 and reactively ion etched to form gate electrode 16. Electrode 16 is defined using conventional photolithographic and etching techniques. The etching must be anisotropic to provide vertical sidewalls on gate electrode 16. The thickness of electrode 16 is between about 1000 to 4000 Angstroms. Lightly doped shallow impurity regions 24 are formed by ion implantation as indicated by arrows 23. The regions 24 are typically between about 500 to 1500 Angstroms in depth with an average impurity concentration of between about $1\times10^{18}$ cm$^{-3}$ to $1\times10^{19}$ cm$^{-3}$. The implantation is typically done with a acceleration voltage of between about 60 KV and an impurity dose of $2.5\times10^{13}$ cm$^{-2}$.

Figure 2:
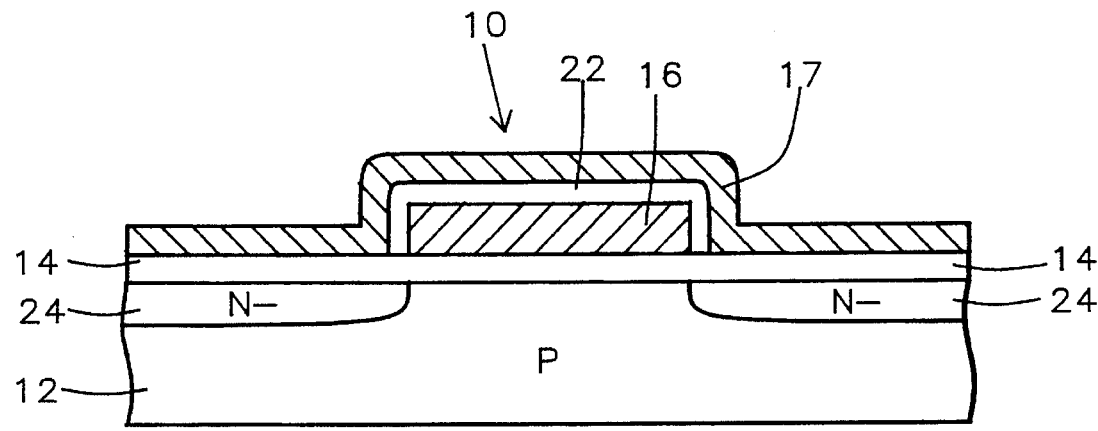

As shown in FIG. 2, a thin silicon oxide layer 22 is grown on the surfaces of electrode 16. Layer 22 is preferably grown by exposing the substrate to dry $O_2$ at 800° C. for 20 minutes. The thin oxide on the sidewall acts as a resistor to reduce the gate to source/drain capacitance. The thin oxide on the top of electrode 16 acts as an etching step for the later polysilicon spacer etch. The oxide formation step also anneals the damage in the gate oxide and at the gate electrode edge, and increases the oxide thickness over the source/drain regions. A conformal polysilicon layer 17 is then deposited over layer 22 and layer 14. Layer 17 is preferably deposited using chemical vapor deposition thickness to a thickness of between about 200 to 1000 Angstroms.

Figure 3:
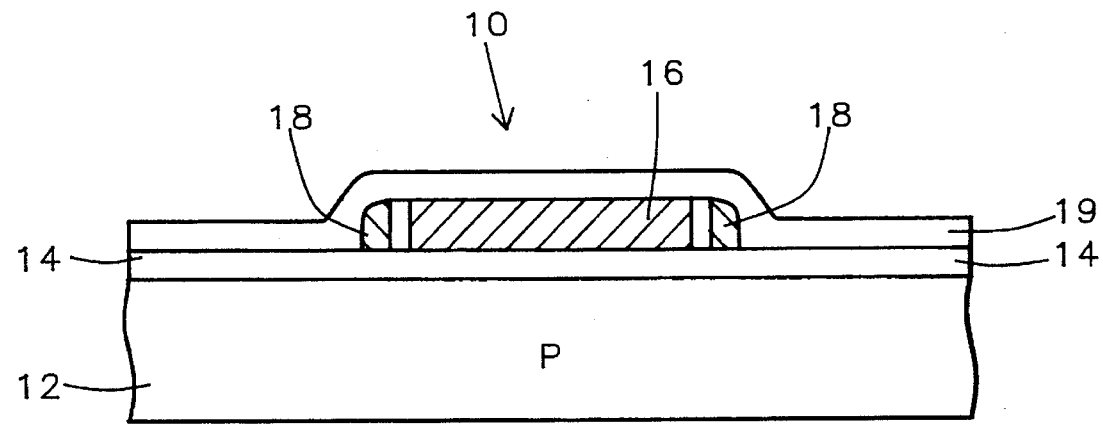

As indicated in FIG. 3, the layer 17 is anisotropically etched to remove the layer portions on the horizontal surface of the substrate and leave spacer elements 18 on the vertical sidewalls of gate electrode 16. A conformal $SiO_2$ layer 19 is then deposited using chemical vapor deposition techniques with a thickness in the range of 500 to 1500 Angstroms.

As shown in FIG. 4, layer 19 is anisotropically etched using reactive ion etching techniques for forming spacer elements 20 over spacer elements 18. Subsequently an ion implantation step, indicated by arrows 28, forms more heavily doped and deeper impurity regions 26, which serve as source and drain regions. The gate electrode and spacer elements serve as a mask to precisely locate the regions 26. The implantation also introduces dopants into the gate electrode and spacer elements 18 making the polysilicon electrically conductive. Furthermore, the deeper source/drain implant damages the top portion of the thin $SiO_2$ film 22, connecting the gate electrode to the spacer elements 18 electrically. The device is then annealed to remove the crystalline damage caused by the ion implantation.

Figure 7:
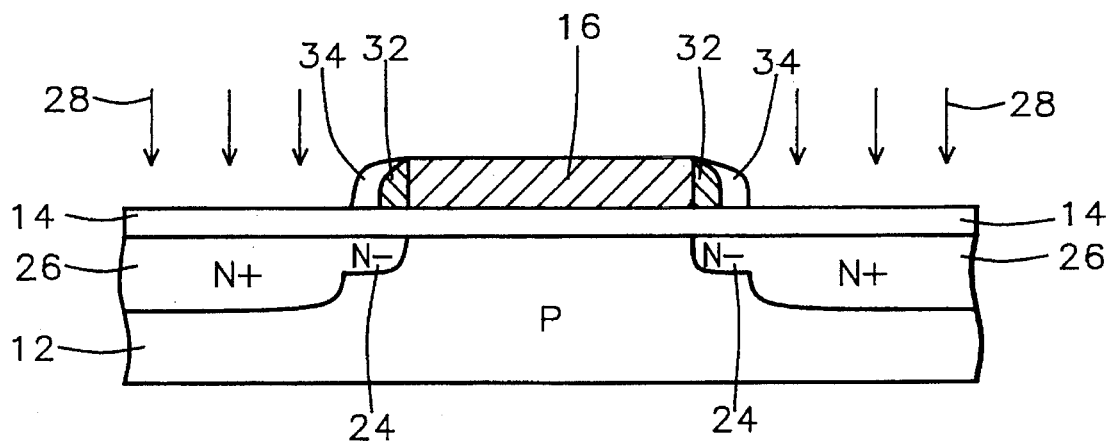

Referring now to FIG. 7, there is depicted a second embodiment 30 of the invention. In this embodiment, the substrate 12, gate oxide layer 14, gate electrode layer 16, and impurity regions 24 and 26 are all similar to the corresponding elements of embodiment 10, described previously. The major difference is that a sidewall spacer element 32 of silicon nitride is provided. An overlying spacer element 34 of SiO$_2$ completes the electrode structure. If desired, a thin layer of SiO$_2$, not shown can be formed on the vertical sidewalls of gate electrode 16. This would be similar to oxide layer 22 in embodiment 10. This layer 22 is optional.

Figure 5:
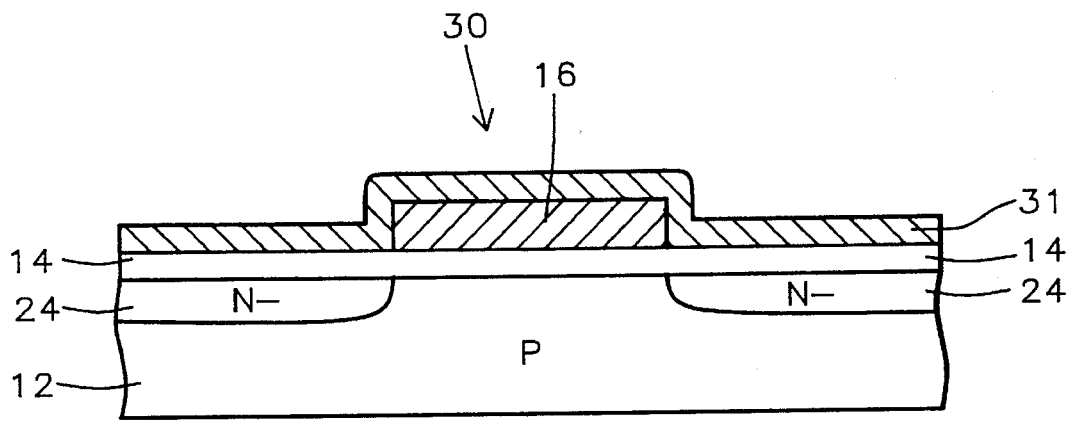
FIGS. 5–7, taken with FIG. 1 are cross sectional views that depict a sequence of steps that illustrate another preferred specific embodiment of the invention.
Figure 6:
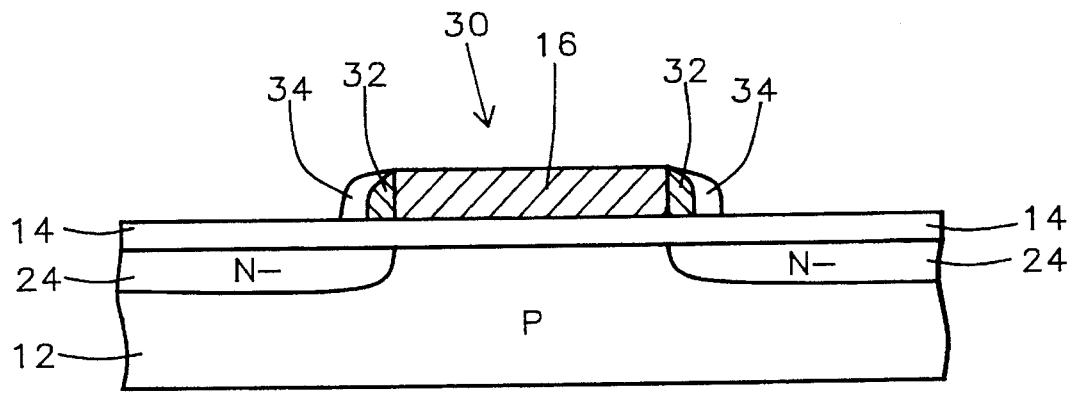

The process of forming embodiment 30 is shown in FIGS. 1 and 5 through 7. The process for forming the structures of FIG. 1 was described previously. In FIG. 5, a conformal layer 31 of silicon nitride is deposited over gate electrode 16 and layer 14. The layer 31 is deposited using chemical vapor deposition techniques to a thickness of between about 200 to 1000 Angstroms. The layer is then anisotropically etched to remove the layer 31 portions over the horizontal surfaces of the device leaving spacer elements 32. A conformal layer 33 of SiO$_2$ is deposited having a thickness of between about 500 to 1500 Angstroms, and anisotropically etched to leave spacer elements 34. Ions are implanted, as indicated by arrows, to form region 26, using the gate electrode and spacer elements 32 and 34 as a mask. In the aforedescribed embodiment, the silicon nitride spacer, due to its higher dielectric constant, helps to increase the vertical electric field above the lightly doped region 24, opposing the hot electron injection.

Figure 8:
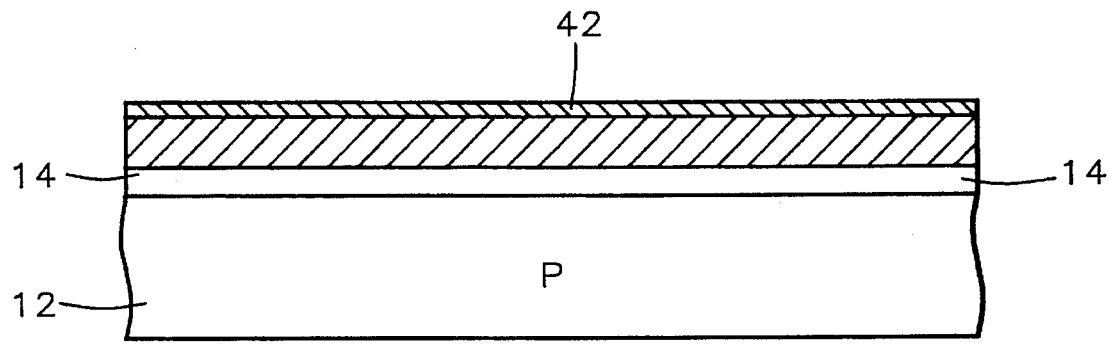
FIGS. 8–10 are cross sectional views that depict a sequence of steps that illustrate yet another preferred embodiment of the invention.
Figure 9:
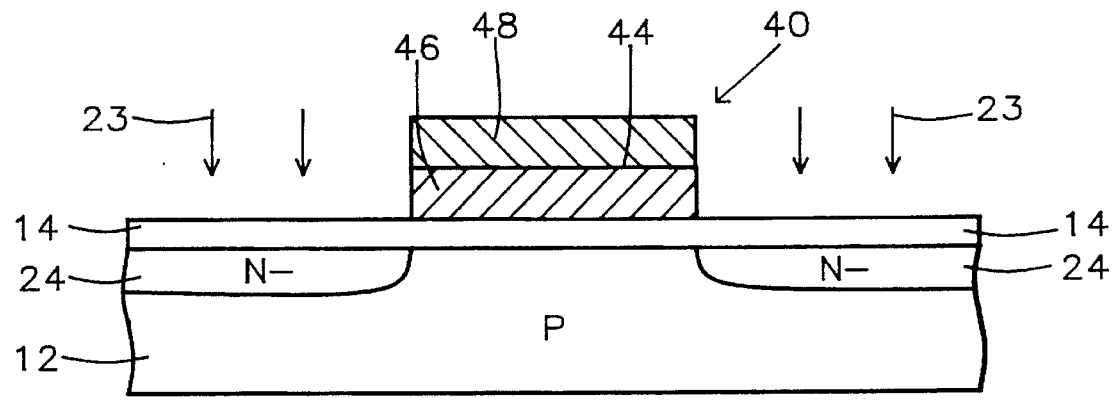
Figure 10:
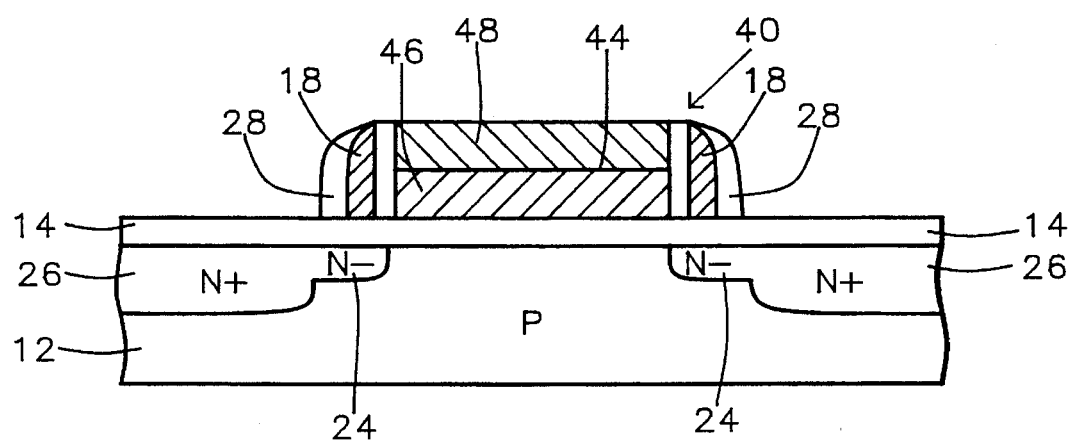

Referring now to FIG. 10, there is depicted a third embodiment 40 of the invention. This embodiment is quite similar to the embodiment 10 shown in FIG. 4 except that the gate electrode is formed of a polycide. Sidewall spacers 18 of polysilicon, and spacer 20 of SiO$_2$ are similar to embodiment 10. FIGS. 8–10 depict the process of fabricating the FET embodiment 40. As shown in FIG. 8, a polycrystalline layer 46 is deposited over SiO$_2$ layer 14, and a refractor metal layer 42 deposited over the polysilicon layer. Layer 42 is preferably a tungsten layer with a thickness of between about 300 to 1000 Angstroms. The gate electrode is heated in nitrogen ambient to forms a refractory metal silicide layer 48 on top of the gate electrode. A portion of the polysilicon gate electrode 46 remains at the bottom. The gate electrode 44 is then defined using conventional photolithographic and etching techniques. An ion implant is performed to form the shallow lightly doped regions 24 as shown in FIG. 9. A thin oxide layer 22 is deposited over the electrode 16. Sidewall spacer elements 18 and 20 are formed on the vertical sidewalls of the gate electrode 44 in the same manner as described previously. Gate electrode consists of a lower polysilicon layer 46 and an upper overlying refractory silicide layer 48. An ion implant is used to form deeper higher impurity source and drain regions 26, as described previously. An oxide layer (not shown) is preferably deposited over the surface of the device, in particular over gate electrode 44, to prevent the polycide layer from peeling during the high temperature device annealing process to remove implant damages.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an FET semiconductor device on a semiconductor substrate, comprising the steps of:

comprising a first conductivity type dopant, forming a polycrystalline silicon gate electrode having vertical sidewalls on said gate insulating layer, forming shallow low concentration impurity regions of a second conductivity type dopant in said substrate using the gate electrode as a mask, forming a silicon oxide film on the sidewall surfaces and top surface of said gate electrode, depositing a layer of polycrystalline silicon over the substrate and gate electrode, reactive ion etching the polycrystalline layer to form polycrystalline silicon spacers on the sidewalls of the gate electrode, depositing a conformal layer of dielectric material over the substrate and gate electrode, reactive ion etching the conformal layer of dielectric material to form dielectric spacers on the sidewalls of the gate electrode and over the polycrystalline silicon spacers, forming deep high concentration source and drain regions of said second conductivity type dopant using the gate electrode and said polycrystalline silicon spacers and said dielectric spacers as a mask, wherein the top portion of the SiO$_2$ film between the gate electrode sidewall and the polycrystalline silicon spacers is damaged to make it conductive enough to keep the gate electrode and the polycrystalline silicon spacers at the same potential, and annealing the substrate to remove crystalline damage.

2. The method of claim 1 wherein the gate insulating layer is formed by oxidizing the silicon substrate to form a layer thickness of between about 70 to 150 Angstroms.

3. The method of claim 1 wherein the first conductivity type is a P conductivity type impurity.

4. The method of claim 1 wherein the gate electrode is deposited using CVD techniques to form a layer with a thickness of between about 1000 to 4000 Angstroms.

5. The method of claim 3 wherein the shallow low concentration impurity regions are formed by ion implantation.

6. The method of claim 5 wherein the shallow impurity regions are formed by implanting phosphorus ions with a voltage between about 30 KV to 80 KV, a concentration between about $1 \times 10^{18}$ cm$^{-3}$ to $1 \times 10^{19}$ cm$^{-3}$, and a tilt angle between about 0° to 60°.

7. The method of claim 1 wherein the layer of dielectric material formed on sidewalls and top surfaces of the gate electrode is thermal oxide having a thickness of between about 30 to 200 Angstroms.

8. The method of claim 1 wherein the polycrystalline silicon layer over the substrate and gate electrode has a thickness of between about 200 to 1000 Angstroms.

9. The method of claim 1 wherein the conformal layer of dielectric material over the substrate and gate electrode has a thickness of between about 500 to 2000 Angstroms and is deposited by chemical vapor techniques.

10. The method of claim 1 wherein the conformal layer of dielectric material over the substrate and the gate electrode is a layer of silicon nitride deposited by chemical vapor techniques.

11. The method of claim 5 wherein the source and drain regions are formed by ion implantation.

12. The method of claim 11 wherein the impurity ions that form high concentration source and drain regions are implanted at a voltage of between about 30 KV to 100 KV at a concentration in the range of $1 \times 10^{19}$ cm$^{-3}$ to $1 \times 10^{21}$ cm$^{-3}$.

13. The method of claim 1 wherein an overlying layer of refractory metal is deposited over said polycrystalline silicon gate electrode, and heated to form a polycide gate layer.

14. The method of claim 13 wherein said overlying layer of refractory metal silicide is deposited over said polycrystalline silicon gate electrode by chemical vapor deposition techniques.

15. The method of claim 13 wherein the resultant polycide gate electrode has a thickness of between about 2000 to 4000 Angstroms.

16. The method of claim 15 wherein said silicon oxide film is deposited over the polycide gate electrode by CVD techniques after the source/drain implant and prior to the device annealing process to prevent polycide peeling of the gate electrode.

* * * * *